US008617936B2

United States Patent
Rahimo et al.

(10) Patent No.: US 8,617,936 B2
(45) Date of Patent: Dec. 31, 2013

(54) REVERSE-CONDUCTING SEMICONDUCTOR DEVICE AND METHOD FOR MANUFACTURING SUCH A REVERSE-CONDUCTING SEMICONDUCTOR DEVICE

(75) Inventors: Munaf Rahimo, Uezwil (CH); Babak H-Alikhani, Sarmenstorf (CH)

(73) Assignee: ABB Technology AG, Zürich (CH)

( * ) Notice: Subject to any disclaimer, the term of this patent is extended or adjusted under 35 U.S.C. 154(b) by 266 days.

(21) Appl. No.: 12/819,607

(22) Filed: Jun. 21, 2010

(65) Prior Publication Data

US 2010/0295093 A1 Nov. 25, 2010

Related U.S. Application Data

(63) Continuation of application No. PCT/EP2008/067873, filed on Dec. 18, 2008.

(30) Foreign Application Priority Data

Dec. 19, 2007 (EP) .................................. 07150162

(51) Int. Cl.
*H01L 21/332* (2006.01)
(52) U.S. Cl.
USPC ........... 438/138; 438/135; 438/136; 438/137; 257/E21.696
(58) Field of Classification Search
USPC .................... 438/135, 136, 137, 138, 315; 257/E21.696, E21.384, E29.022, 257/E29.037
See application file for complete search history.

(56) References Cited

U.S. PATENT DOCUMENTS

| 6,054,748 A | 4/2000 | Tsukuda et al. |
| 6,110,763 A * | 8/2000 | Temple .......................... 438/133 |

(Continued)

FOREIGN PATENT DOCUMENTS

| DE | 39 17 769 A1 | 12/1990 |
| DE | 198 11 568 A1 | 9/1998 |

OTHER PUBLICATIONS

International Search Report (PCT/ISA/210) for PCT/EP2008/067873 dated Apr. 2, 2009.

(Continued)

*Primary Examiner* — Jarrett Stark
(74) *Attorney, Agent, or Firm* — Buchanan Ingersoll & Rooney PC

(57) ABSTRACT

A method for manufacturing a reverse-conducting semiconductor device (RC-IGBT) with a seventh layer formed as a gate electrode and a first electrical contact on a emitter side and a second electrical contact on a collector side, which is opposite the emitter side, a wafer of a first conductivity type with a first side and a second side opposite the first side is provided. For the manufacturing of the RC-IGBT on the collector side, a first layer of the first conductivity type or of a second conductivity type is created on the second side. A mask with an opening is created on the first layer and those parts of the first layer, on which the opening of the mask is arranged, are removed. The remaining parts of the first layer form a third layer. Afterwards, for the manufacturing of a second layer of a different conductivity type than the third layer, ions are implanted into the wafer on the second side into those parts of the wafer, on which the at least one opening is arranged. Then the mask is removed and an annealing for the activation of the second layer is performed and a second electrical contact, which is in direct electrical contact to the second and third layer, is created on the second side.

21 Claims, 8 Drawing Sheets

(56) References Cited

U.S. PATENT DOCUMENTS

| | | |
|---|---|---|
| 7,635,892 B2 * | 12/2009 | Tokuda et al. .............. 257/328 |
| 2002/0137264 A1 * | 9/2002 | Kao et al. ................. 438/138 |
| 2005/0017290 A1 | 1/2005 | Takahashi et al. |
| 2005/0156283 A1 * | 7/2005 | Tokuda et al. .............. 257/622 |
| 2011/0281406 A1 * | 11/2011 | Ogino et al. ............... 438/138 |

OTHER PUBLICATIONS

Written Opinion (PCT/ISA/237) for PCT/EP2008/067873 dated Apr. 2, 2009.

European Search Report for EP 07150162.1 dated Jun. 9, 2008.

* cited by examiner

REVERSE-CONDUCTING SEMICONDUCTOR DEVICE AND METHOD FOR MANUFACTURING SUCH A REVERSE-CONDUCTING SEMICONDUCTOR DEVICE

RELATED APPLICATIONS

This application claims priority as a continuation application under 35 U.S.C. §120 to PCT/EP2008/067873, which was filed as an International Application on Dec. 18, 2008 designating the U.S., and which claims priority to European Application 07150162.1 filed in Europe on Dec. 19, 2007. The entire contents of these applications are hereby incorporated by reference in their entireties.

FIELD

The disclosure relates to the field of power electronics and more particularly to a method for manufacturing a reverse-conducting semiconductor device and to a converter including a reverse-conducting semiconductor device.

BACKGROUND INFORMATION

In U.S. Patent Application Publication No. 2005/0017290, a reverse-conducting semiconductor device 10, which also can be called a reverse-conducting insulated gate bipolar transistor (RC-IGBT), is described. The reverse-conducting semiconductor device 10 can include within one wafer an insulated gate bipolar transistor with a built-in freewheeling diode. As shown in FIG. 1, such a reverse-conducting semiconductor device 10 can include a base layer 1 formed as an n type base layer with a first main side and a second main side opposite the first main side. The first main side can form the emitter side 101 of the insulated gate bipolar transistor and the second main side can form the collector side 102 of the insulated gate bipolar transistor. A fourth p type layer 4 can be arranged on the emitter side 101. On the fourth layer 4, a fifth n type layer 5 with a higher doping than the base layer 1 can be arranged on the emitter side 101.

A sixth electrically insulating layer 6 can be arranged on the emitter side 101 and covers the fourth layer 4 and the base layer 1 and partially covers the fifth layer 5. An electrically conductive seventh layer 7 can be embedded in the sixth layer 6. Above the central part of the fourth layer 4 no fifth or sixth layer 5, 6 is arranged.

On this central part of the fourth layer 4, a first electrical contact 8 can be arranged, which covers the sixth layer 6. The first electrical contact 8 can be in direct electrical contact to the fifth layer 5 and the fourth layer 4 but can be electrically insulated from the seventh layer 7.

On the collector side 102, a buffer layer 13 can be arranged on the base layer 1. On the buffer layer 13, p type third layers 3 and n type second layers 2 can be arranged alternately in a plane. The second layers 2 can have a higher doping than the base layer 1. The second layers 2 can be arranged directly below the fourth layer 4 and the first electrical contact 8 if seen in orthographic projection.

A second electrical contact 9 can be arranged on the collector side 102 and covers the second and third layers 2, 3 and can be in direct electrical contact to them.

In such a reverse-conducting semiconductor device 1, a freewheeling diode can be formed between the second electrical contact 9, part of which forms a cathode electrode in the diode, the second layer 2, which forms a cathode region in the diode, the base layer 1, part of which forms a base layer in the diode, the fourth layer 4, part of which forms an anode region in the diode and the first electrical contact 8, which forms an anode in the diode.

An insulated gate bipolar transistor can be formed between the second electrical contact 9, part of which can form a collector electrode in the IGBT, the third layer 3, which can form a collector region in the IGBT, the base layer 1, part of which can form a base layer, the fourth layer 4, part of which can form a p-base region in the IGBT, the fifth layer 5, which can form a source region in the IGBT, and the first electrical contact 8, which can form an emitter electrode. During on-state of the IGBT a channel can be formed between the emitter electrode, the source region and the p-base region towards the n-base layer.

The layers of the RC-IGBT on the collector side 102 can be manufactured by implanting and diffusing p type ions. Afterwards a resist mask can be introduced, through which n type ions can be implanted and afterwards diffused. The implantation dose of the n type ions has to be so high that it compensates the p type region. The p and n type implantation steps can also be reversed.

DE 198 11 568 refers to an IGBT and a manufacturing method for such an IGBT with a built-in MOSFET, which includes on the backside, alternating p doped third layer and n doped second layer. These layers can be arranged in different, not overlapping planes. A p doped third layer can be formed and recesses can be formed in this layer by etching. N type ions can then be implanted over the whole backside surface and afterwards a heat treatment can be performed, by which the n and p type layers can be created. Therefore, the n type ions can be implanted also on those parts, on which p type ions can be arranged, which implies that the p dose has to be higher than the n dose.

In another manufacturing method described in DE 198 11 568, first recesses can be created, then the second main side can be irradiated in those parts without recess with electrons or protons and afterwards phosphorous ion implantation can be made over the whole surface. Then p doped ions can be implanted into that part without recesses, so that again the dose of the p type ions has to be higher than the n dose. A heat treatment can be performed for forming the n type second layer and p type third layer.

Due to overcompensation, limited selection for dose and depth of the latter manufactured layer of the second and third layer 2, 3 are only possible and the control for the p and n region injection efficiencies can be unsatisfactory. On-state snap-back effects, defined by the point at which the conduction voltage and current characteristics change from MOS operation mode to IGBT operation mode, can occur, which are undesirable for the device in the IGBT mode. FIG. 16 shows the output characteristics of the RC-IGBT current $I_c$ to voltage $V_{ce}$. The dashed line 14 shows the strong overshoot resulting from the snap-back effect, as it is typical for a known RC-IGBT during the change from MOS to IGBT operation mode. FIG. 17 shows the RC-IGBT current waveform in the diode mode during reverse recovery of the device. A known RC-IGBT shows a snappy behaviour of the device during reverse recovery (dotted line 17). The snappy behaviour can also be present during turn-off for the IGBT as well as for the diode reverse recovery (FIG. 18).

SUMMARY

A method for manufacturing a reverse-conducting semiconductor device is disclosed, which includes a freewheeling diode and an insulated gate bipolar transistor on a common wafer. The insulated gate bipolar transistor includes an emitter side and a collector side, in which the wafer of a first conductivity type with a first side and a second side opposite the first side is provided. The first side forms the emitter side and the second side forms the collector side of the insulated gate bipolar transistor. The method includes creating a first layer of the first conductivity type or of a second conductivity type on the second side, creating a mask with at least one opening on the first layer and removing those parts of the first layer, on which an opening of the mask is arranged, the remaining parts of the first layer forming the third layer, implanting ions into the wafer on the second side into those parts of the wafer, on which the at least one opening is arranged and using the mask as a barrier for the ions to form a second layer of a different conductivity type than the third layer, removing the mask and performing annealing for the activation of the second layer, and creating a second electrical contact, which is in direct electrical contact to the second and third layer, on the second side.

BRIEF DESCRIPTION OF DRAWINGS

The subject matter of the disclosure will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
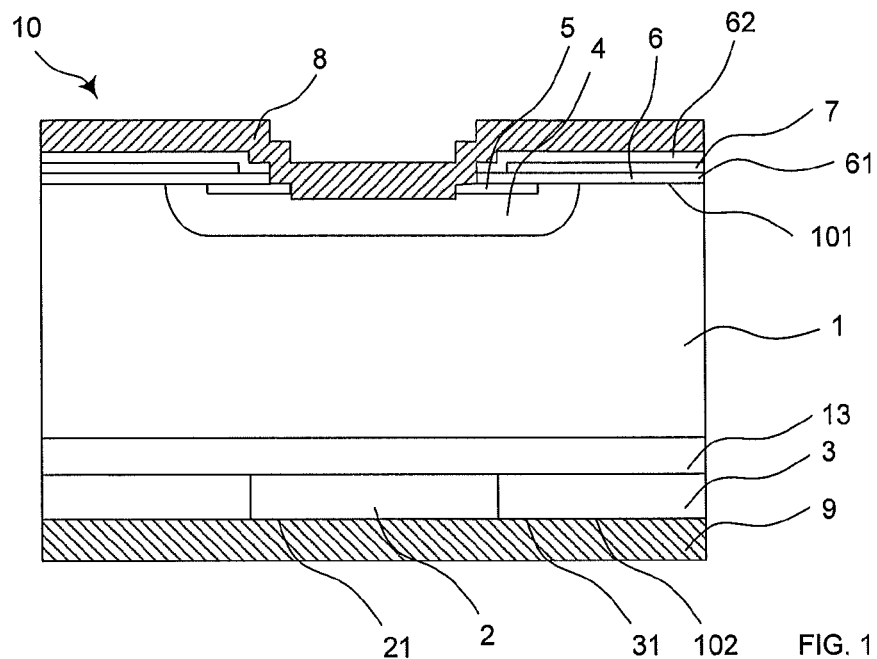
FIG. 1 shows a cross sectional view on a known reverse-conducting IGBT.

The disclosure relates to an exemplary method for manufacturing an exemplary reverse-conducting insulated gate bipolar transistor, which can be less susceptible for on-state snap-back effects than known RC-IGBTs and which can provide better control for the above mentioned electrical properties of the diode and IGBT, and to provide an exemplary reverse-conducting insulated gate bipolar transistor.

For the exemplary method for manufacturing an exemplary reverse-conducting semiconductor device which includes a freewheeling diode and an insulated gate bipolar transistor on a common wafer (11), wherein the insulated gate bipolar transistor includes an emitter side and a collector side, a wafer of a first conductivity type with a first side and a second side opposite the first side is provided. The first side (111) can form the emitter side and the second side (112) can form the collector side of the insulated gate bipolar transistor.

For the manufacturing of the exemplary reverse-conducting semiconductor device on the collector side the following can be performed:

a first layer of the first conductivity type or of a second conductivity type can be created on the second side;

a mask with at least one opening can be created on the first layer and those parts of the first layer, on which an opening of the mask is arranged, can be removed, the remaining parts of the first layer forming a third layer;

afterwards for the manufacturing of a second layer of a different conductivity type than the third layer, ions can be implanted into the wafer on the second side into those parts of the wafer, on which the at least one opening is arranged and using the mask (12) as a barrier for the ions;

afterwards the mask can be removed; and a second electrical contact, which is in direct electrical contact to the second and third layer, can be created on the second side.

After the removal of the mask an anneal step for the activation of the second layer 2 can be performed.

The exemplary reverse-conducting semiconductor device according to the disclosure includes a freewheeling diode and an insulated gate bipolar transistor on a common wafer. Part of the wafer forms a base layer. The insulated gate bipolar transistor includes an emitter side and a collector side and the emitter side can be arranged opposite of the collector side. A first electrical contact can be arranged on the emitter side and a second electrical contact on a collector side, which is opposite the emitter side. At least one third layer of a first or second conductivity type and at least one second layer of a different conductivity type than the third layer, can be arranged on the collector side. The at least one second and third layers can be arranged alternately. The second electrical contact can be in direct electrical contact to the at least one second and third layer. The at least one second layer can be arranged in a first plane parallel to the collector side and the at least one third layer can be arranged in a second plane parallel to the collector side. The first plane and the second plane are spaced from each other by at least the thickness of that layer of the at least one second or third layer, which can be arranged farther away from the emitter side.

With such a manufacturing method for an exemplary RC-IGBT, an RC-IGBT can be provided with good control for the second and third layers, i.e. the cathode layer in the diode and the collector layer in the IGBT part of the device. Overcompensation of any layer can be eliminated and the layers can be made thin.

Figure 16:
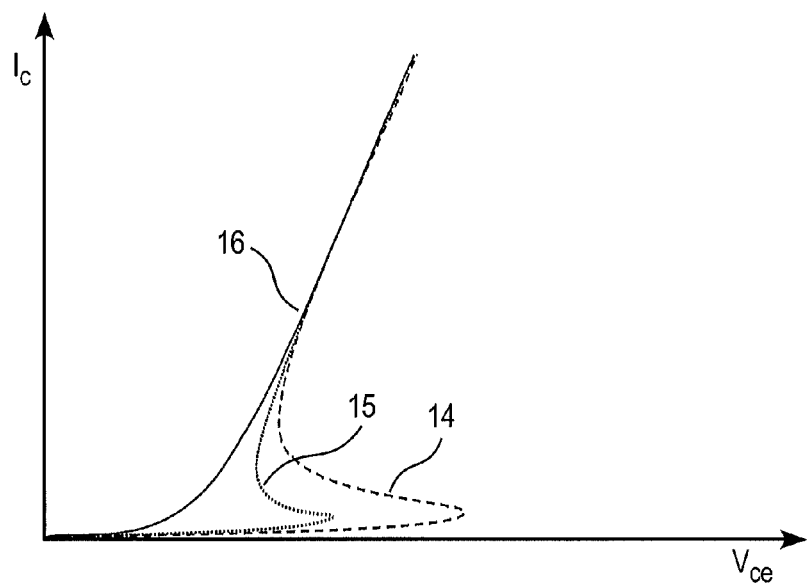
FIG. 16 shows the current/voltage output characteristics of a known RC-IGBT and an RC-IGBT according to the disclosure.
Figure 17:
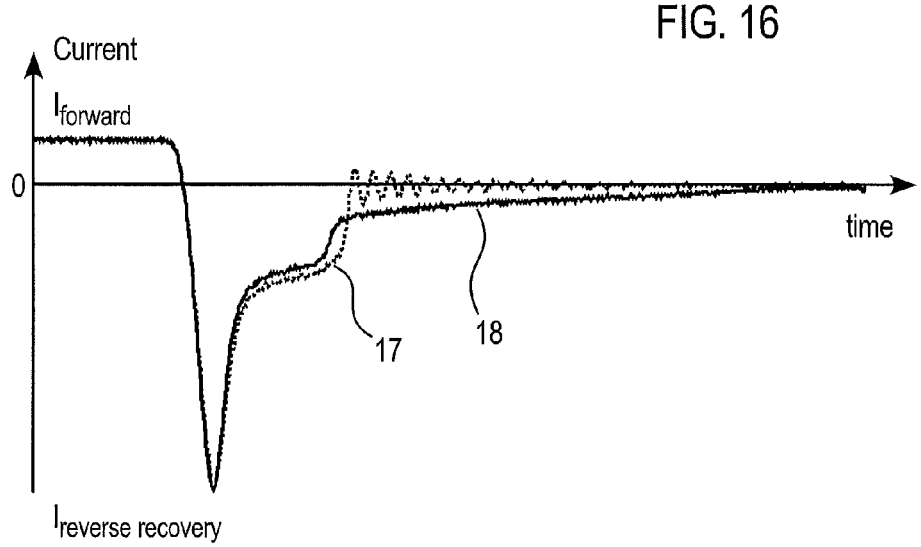
FIG. 17 shows the RC-IGBT current waveform in diode mode during reverse recovery of a known RC-IGBT and an exemplary RC-IGBT according to the disclosure.
Figure 18:
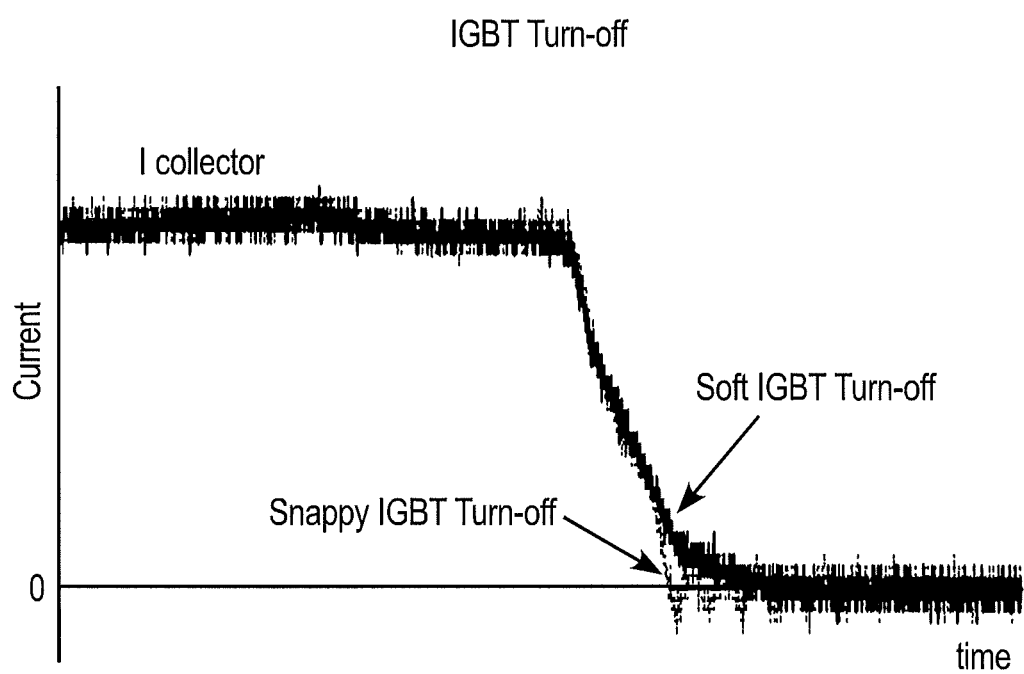
FIG. 18 shows the RC-IGBT current waveform in diode mode during turn-off of a known RC-IGBT and an exemplary RC-IGBT according to the disclosure.

When the exemplary RC-IGBT is manufactured with second and third layers, one of these layer types having a stronger p doping than the n doping of the other layer type, snap-back effects can be further minimized or even eliminated. See dotted line 15 and solid line 16 in FIG. 16. At least one layer of the second or third layer, which is of a different conductivity type than the base layer, can be created with a higher dose than the at least one layer of the second and third layer, which is of the same conductivity type as the base layer. It can be useful to have stronger p doping than n doping also for diode properties as well as for IGBT properties. Furthermore, stronger p doping can provide soft diode recovery and soft IGBT turn-off reducing or eliminating snappiness of the current during reverse recovery and turn-off due to hole injection from that layer of the second and third layer, which is p doped. See FIG. 17, solid line 18. The soft performance can also be achieved for the IGBT turn-off as well as for the diode reverse recovery as shown in FIG. 18.

Figure 2:
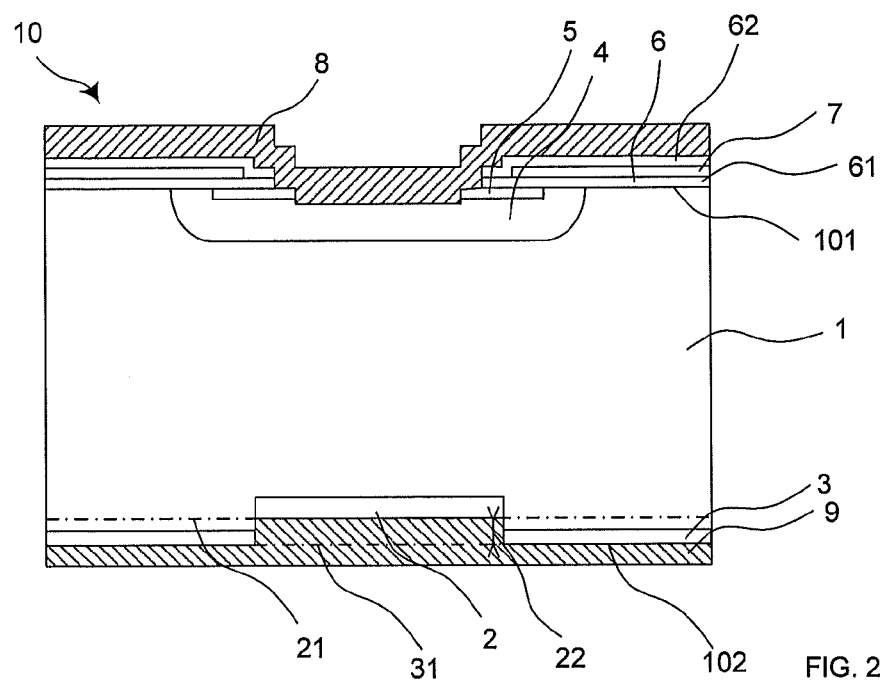
FIG. 2 shows a cross sectional view of an exemplary embodiment of a reverse-conducting IGBT according to the disclosure.

In FIG. 2, a first exemplary embodiment of a reverse-conducting semiconductor device 10, also called reverse-conducting insulated gate bipolar transistor (RC-IGBT) is shown. The RC-IGBT 10 includes an n type base layer 1 with an emitter side 101 and a collector side 102 opposite the emitter side 101. A p type fourth layer 4 can be arranged on the emitter side 101. At least one n type fifth layer 5 can be arranged on the emitter side 101 and is surrounded by the fourth layer 4. The at least one fifth layer 5 has a higher doping than the base layer 1. A sixth electrically insulating layer 6 can be arranged on the emitter side 101 on top of the first, fourth and fifth layer 1, 4, 5. It at least partially covers the at least one fifth layer 5, the fourth layer 4 and the base layer 1. An electrically conductive seventh layer 7 can be arranged on the emitter side 101 electrically insulated from the at least one fourth layer 4, the fifth layer 5 and the base layer 1 by the sixth layer 6. Preferably, the seventh layer 7 can be embedded in the sixth layer 6.

The sixth layer 6 can include a first electrically insulating layer 61, made, for example, of a silicon dioxide, and a second electrically insulating layer 62, also made, for example, of a silicon dioxide, and for example, of the same material as the first electrically insulating layer 61. The second electrically insulating layer 62 covers the first electrically insulating layer 61. For an RC-IGBT 10 with a seventh layer 7 formed as a planar gate electrode as shown in FIG. 2, the first electrically insulating layer 61 can be arranged on top of the emitter side 101. In between the first and second electrically insulating layers 61, 62, which form the sixth layer 6, the seventh layer 7, which forms a gate electrode, can be embedded. For example, it can be completely embedded. Thus, the seventh layer 7 can be separated from the first, fourth and fifth layer 1, 4, 5 by the first electrically insulated layer 61. The seventh layer 7 can be made of a heavily doped polysilicon or a metal like aluminum.

The at least one fifth layer 5, the seventh layer 7 and the sixth layer 6 can be formed in such a way that an opening is created above the fourth layer 4. The opening can be surrounded by the at least one fifth layer 5, the seventh layer 7 and the sixth layer 6.

A first electrical contact 8 can be arranged on the emitter side 101 within the opening so that it is in direct electrical contact to the fourth layer 4 and the fifth layer 5. This first electrical contact 8 can also cover the sixth layer 6 but is separated and thus electrically insulated from the seventh layer 7 by the second electrically insulating layer 62.

At least one p type third layer 3 and at least one n type second layer 2 can be arranged on the collector side 102 and the second layer 2 has a higher doping than the base layer 1. The at least one second layer 2 can be arranged in a first plane 21 parallel to the collector side 102, and the at least one third layer 3 can be arranged in a second plane 31 also parallel to the collector side 102. The first plane 21 and the second plane 31 can be spaced from each other at least by the thickness of that layer, of the at least one second or third layer 2, 3, which is arranged farther away from the emitter side 101. The at least one second and third layers 2, 3 can be arranged alternately, i.e. the second and third layers 2, 3 do not overlap and there is no area, in which the second layer and third layer 2, 3 are arranged above each other.

The first and second plane 21, 31 in this description shall be understood as the plane, which corresponds to that surface of the respective layer, which lies opposite the base layer 1, i.e., in the finalized device, that side of the layer is meant, on which the second electrical contact 9 is arranged.

In FIG. 2 it is shown that the p type third layers 3 can be arranged farther away from the emitter side 101. The first plane 21 of the second layer 2 has a distance 22 from the second plane 31 of the third layer 3, which is greater than the thickness of the third layers 3 so that no part of the third layers 3 extends into the first plane 21.

Figure 6:
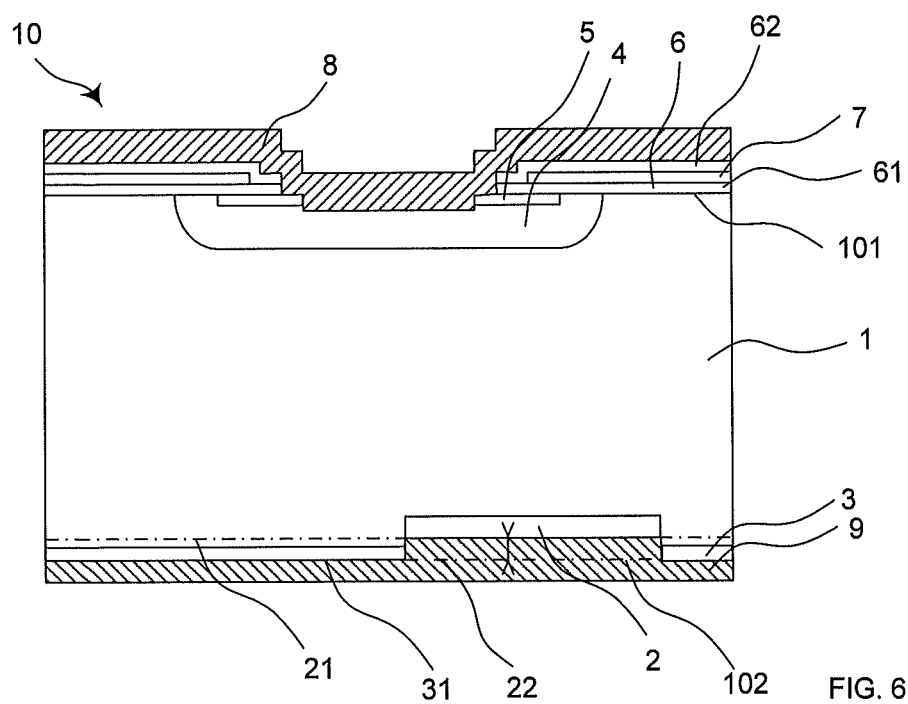
FIG. 6 shows a cross sectional view of another exemplary embodiment of a reverse-conducting IGBT according to the disclosure.

In an exemplary embodiment, the second layer 2 can be arranged directly below the first electrical contact 8, but the position of the second layer 2 can also be shifted to a side as shown in FIG. 6. It is not necessary to have the second layer 2 aligned to the first electrical contact 8.

In another exemplary embodiment, the first plane 21 and the second plane 31 can be spaced from each other by a distance between 0.5 μm up to 2 μm. In this case, the third or second layer 2, 3, which is farther away from the emitter side 101 can have a thickness of less than 0.5 μm up to 2 μm, depending on the distance of the first and second plane 21, 31.

Figure 4:
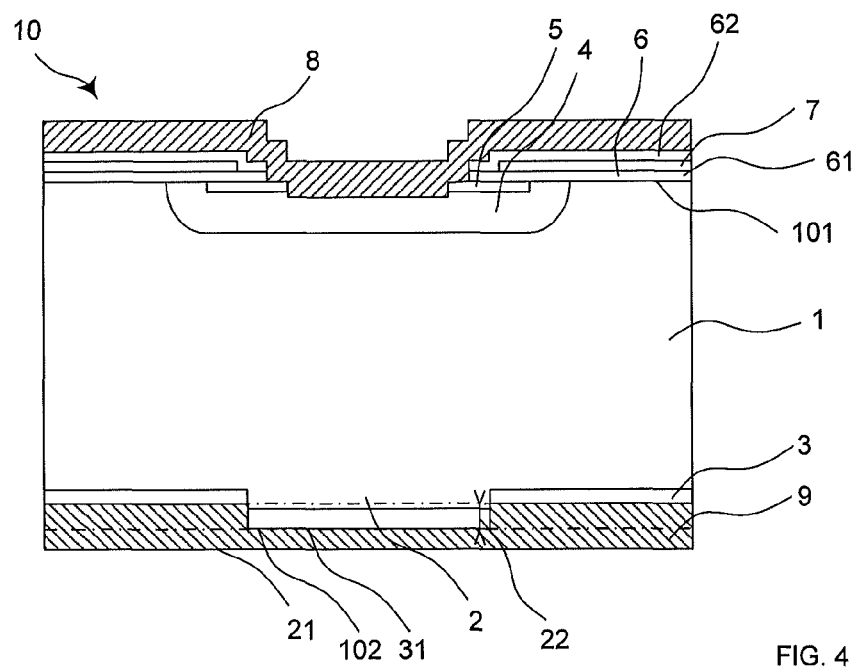
FIG. 4 shows a cross sectional view of another exemplary embodiment of a reverse-conducting IGBT according to the disclosure.

In another exemplary embodiment, the position of the first and second planes 21, 31 as disclosed above can be reversed so that the first plane 21 and thus the second layer 2, is positioned farther away from the emitter side 101 than the second plane 31, i.e. the third layer 3 (FIG. 4).

A second electrical contact 9 can be arranged on the collector side 102 and it is in direct electrical contact to the at least one second and third layers 2, 3.

As an alternative, the conductivity types of the second and third layers 2, 3 can be reversed, i.e. in this case the second layer 2 is of p type and the third layer 3 is of n type.

Figure 5:
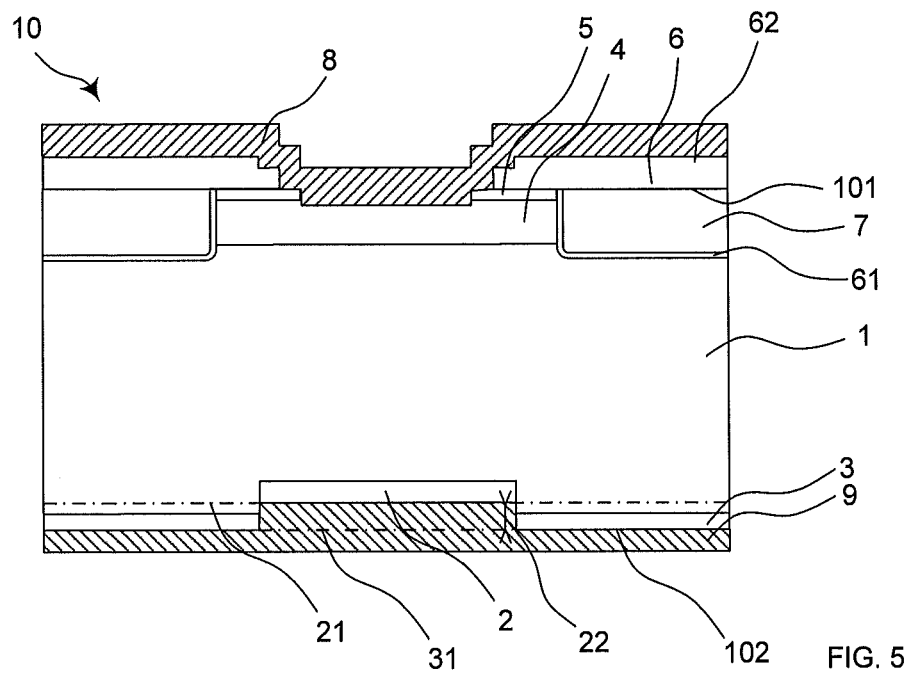
FIG. 5 shows a cross sectional view of another exemplary embodiment of a reverse-conducting IGBT according to the disclosure.

Alternatively to the exemplary RC-IGBT with a planar gate electrode, am exemplary RC-IGBT can include a seventh layer 7', formed as trench gate electrode as shown in FIG. 5. The trench gate electrode 7' can be arranged in the same plane as the fourth layer 4 and adjacent to the fifth layer 5, separated from each other by a first insulating layer 61, which also separates the seventh layer 7' from the base layer 1. A second insulating layer 62 can be arranged on top of the seventh layer 7' formed as a trench gate electrode 7', thus insulating the seventh layer 7' from the first electrical contact 8.

Figure 3:
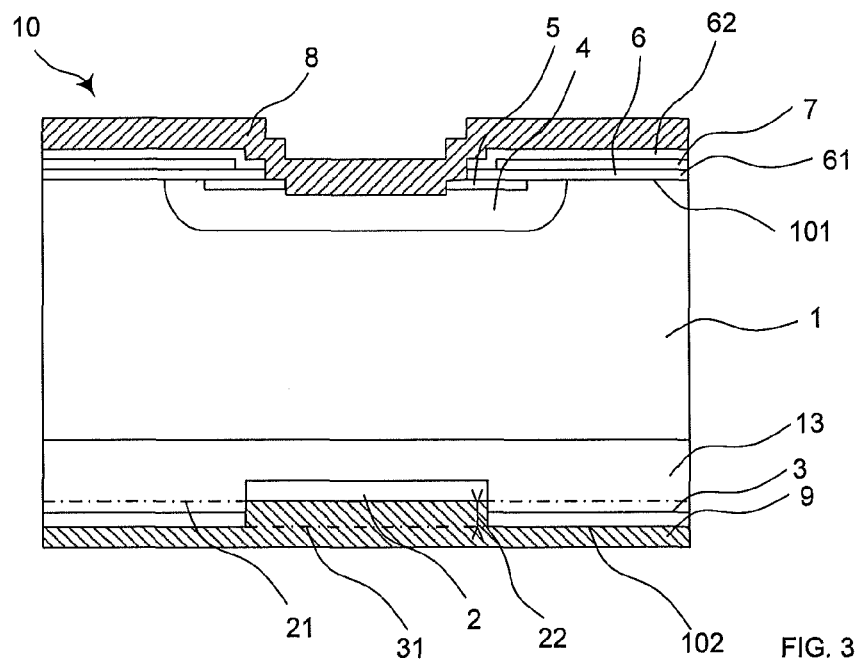
FIG. 3 shows a cross sectional view of another exemplary embodiment of a reverse-conducting IGBT according to the disclosure.

As shown in FIG. 3, in another exemplary embodiment, the RC-IGBT 10 can include an n type buffer layer 13, which can be arranged between the base layer 1 and the first 21 or second plane 31 respectively, in which the at least one second and third layers 2, 3 can be arranged and in which buffer layer 13 has a higher doping than the base layer 1 and a lower doping than the second layer 2.

Figure 15:
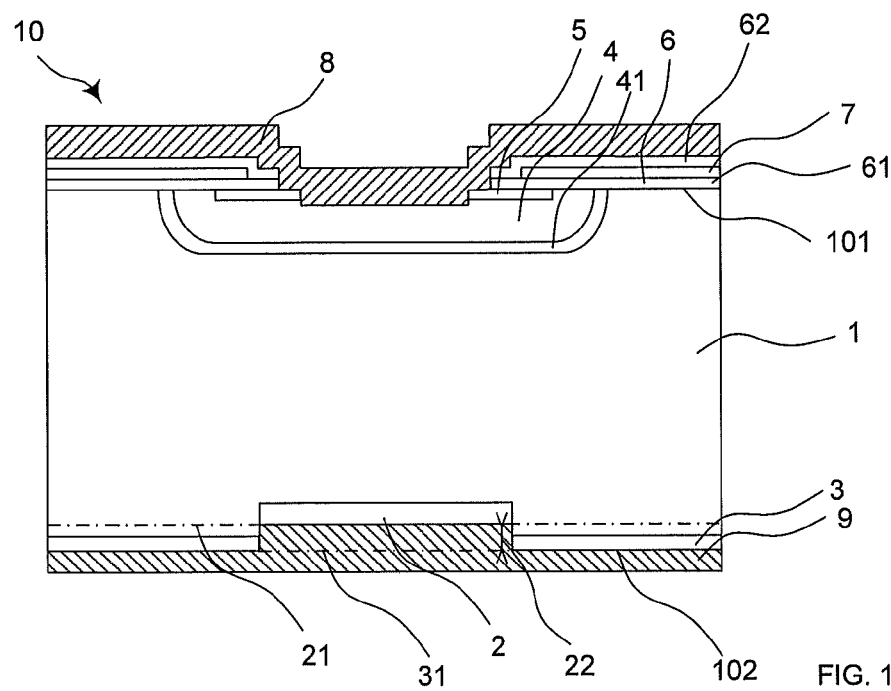
FIG. 15 shows a cross sectional view of another exemplary embodiment of an exemplary reverse-conducting IGBT according to the disclosure.

In another exemplary embodiment shown in FIG. 15, a ninth n doped layer 41, formed as an enhancement layer, can be arranged between the fourth layer 4 and the base layer 1 for having lower on-state losses. The ninth layer 41 can separate the fourth layer 4 from the base layer 1 and it can have higher doping than the base layer 1.

In another exemplary embodiment, the conductivity types of the layers can be switched, i.e. all layers of the first conductivity type are p type (for example, the base layer 1) and all layers of the second conductivity type are n type (for example, the fourth layer 4). Also in this case, the second layer 2 can be of n type or p type and the third layer 3 of the reverse conductivity type, i.e. p type (in case of n type second layer 2) or n type (in case of p type second layer 2).

In an exemplary RC-IGBT 10, a diode can be formed between the first electrical contact 8, which can form an anode electrode in the diode, the fourth layer 4, part of which can form an anode layer, the base layer 1, part of which can form a base layer, that layer of the second layer 2 or third layer 3, which is of n type and which layer can form a cathode layer, and the second electrical contact 9, which can form a cathode electrode.

In an exemplary RC-IGBT 10, an insulating bipolar transistor (IGBT) can be formed between the first electrical contact 8, which can form an emitter electrode in the IGBT, the fifth layer 5, which can form a source region, the fourth layer 4, part of which can form a channel region, the base layer 1, part of which can form a base region, that layer of the third layer 3 or the second layer 2, which is of p type and which can form a collector layer and the second electrical contact 9, part of which can form a collector electrode.

An exemplary reverse-conducting semiconductor device 10 can for example be used in a converter.

Figure 7:
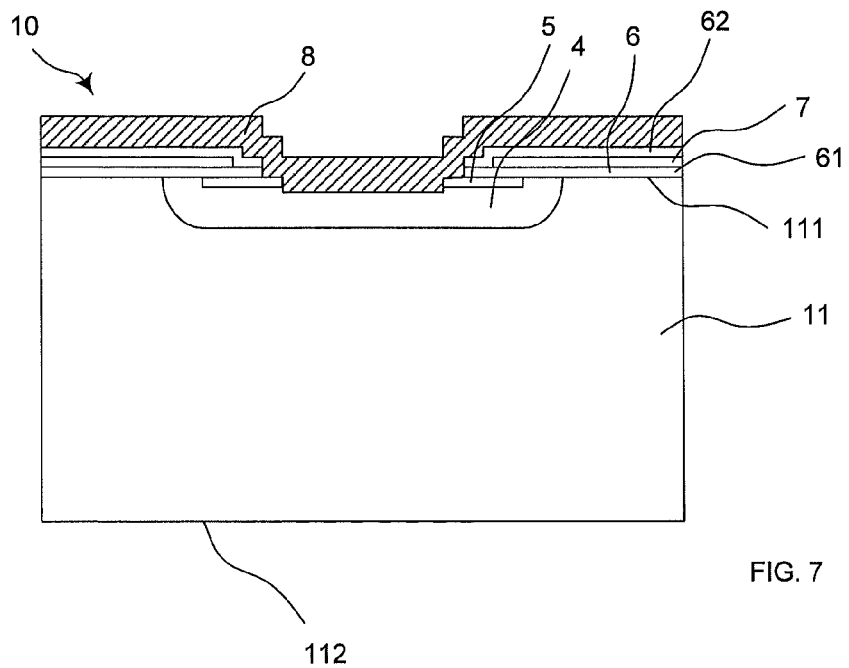
FIG. 7 shows a manufacturing step in an exemplary manufacturing method of an exemplary reverse-conducting IGBT according to the disclosure.

For manufacturing an exemplary reverse-conducting semiconductor device 10 with a seventh layer 7 formed as a planar gate electrode and a first electrical contact 8 on a emitter side 101 and a second electrical contact 9 on a collector side 102, which is opposite the emitter side 101, the following can be performed for forming the layers on the emitter side 101 of the RC-IGBT 10, resulting in a semi-fabricated RC-IGBT 10 as shown in FIG. 7.

An n type wafer 11 with a first side 111 and a second side 112 opposite the first side 111 can be provided. That part of the wafer 11, which has an unamended doping in the finalized reverse-conducting insulated gate bipolar transistor, forms a base layer 1.

A first electrically insulating layer 61 can be partially created on the first side 111.

An electrically conductive seventh layer 7 can be created on the first side 111, which can be arranged on the first electrically insulating layer 61. The seventh layer 7 can be made of a heavily doped polysilicon or a metal like aluminum.

Afterwards a p type fourth layer 4 can be created on the first side 111.

Then at least one n type fifth layer 5, which is surrounded by the fourth layer 4, can be created on the first side 111. The fifth layer 5 has a higher doping than the base layer 1.

A second electrically insulating layer 62 can be formed on the electrically conductive seventh layer 7 in such a way, that the seventh layer 7 is arranged between the first and second electrically insulating layers 61, 62 and the seventh layer 7 can be completely embedded. The second electrically insulating layer 62 can be made of a low-temperature silicon dioxide material as described beforehand. The first and second electrically insulating layers 61, 62 can form a sixth layer 6.

The at least one fifth layer, the sixth layer and the seventh layer 5, 6, 7 can be created in such a way that they form an opening above the fourth layer 4.

A first electrical contact 8 can be created on the first side 111, which is arranged within the opening and which is in direct electrical contact to the fourth layer 4 and the fifth layer 5. The first electrical contact 8 can cover the sixth layer 6.

Similar steps, well-known to semiconductor experts, can be performed for an exemplary RC-IGBT with trench-gate structure.

The layers on the second side 112 of the wafer 11 can be manufactured after manufacturing the layers on the first side 111 either before or after creating the first electrical contact 8 or at any stage during the manufacturing of the layers on the second side 112. There can be done thinning of the wafer 11 on the second side 112 before performing any other processing on the second side 112 as described below. The thinning can be done for the manufacturing of low voltage devices (i.e., for voltages below 1700 V).

Figure 8:
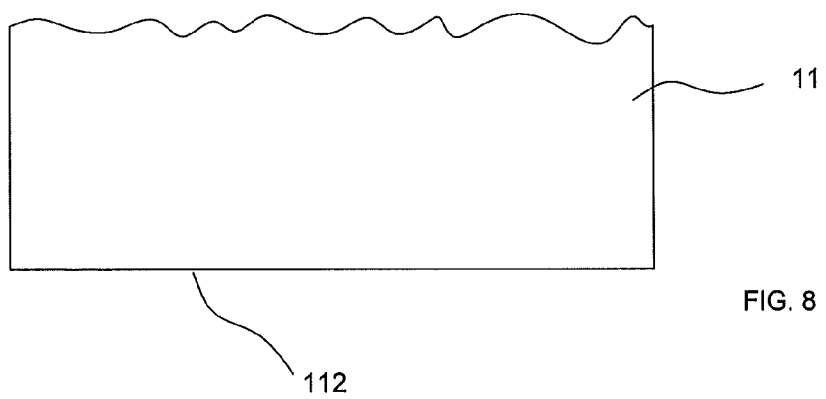
FIG. 8 shows another manufacturing step in an exemplary manufacturing method of an exemplary reverse-conducting IGBT according to the disclosure.
Figure 9:
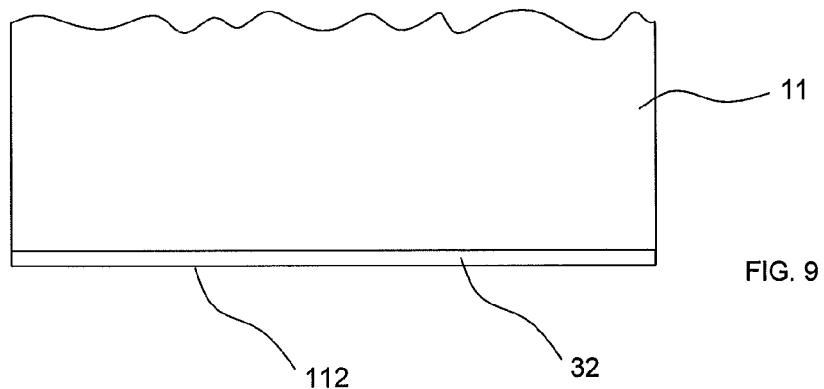
FIG. 9 shows a further manufacturing step in an exemplary manufacturing method of an exemplary reverse-conducting IGBT according to the disclosure.

In the following, an exemplary method for fabricating the layers of the RC-IGBT on the collector side 102 is explained. As shown in FIG. 8, an n type wafer 11 with a first side 111 and a second side 112 opposite the first side 111 is provided. In FIG. 8 only the second side 112 of the wafer 11 is shown. On the first side 111, part or all of the layers, which are arranged on that side in the finalized RC-IGBT may have been manufactured before, for example, by using a semi-fabricated RC-IGBT as shown in FIG. 7.

That part of the wafer 11, which has an unamended doping in the finalized reverse-conducting insulated gate bipolar transistor, can form a base layer 1.

Figure 10:
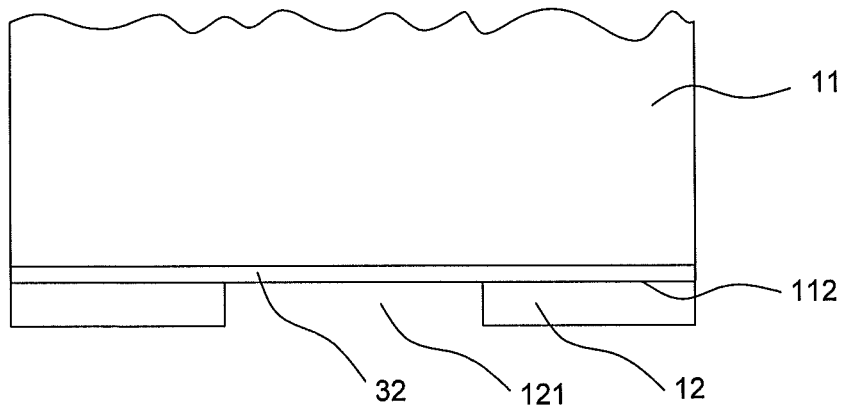
FIG. 10 shows a manufacturing step in an exemplary manufacturing method of an exemplary reverse-conducting IGBT according to the disclosure.
Figure 11:
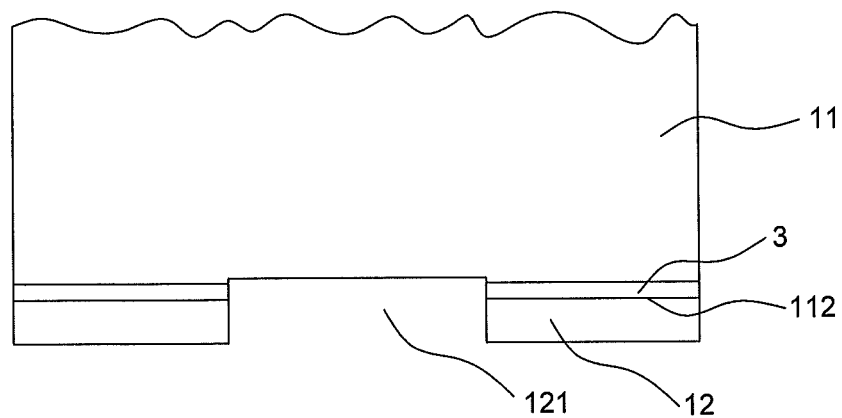
FIG. 11 shows a manufacturing step in an exemplary manufacturing method of an exemplary reverse-conducting IGBT according to the disclosure.
Figure 12:
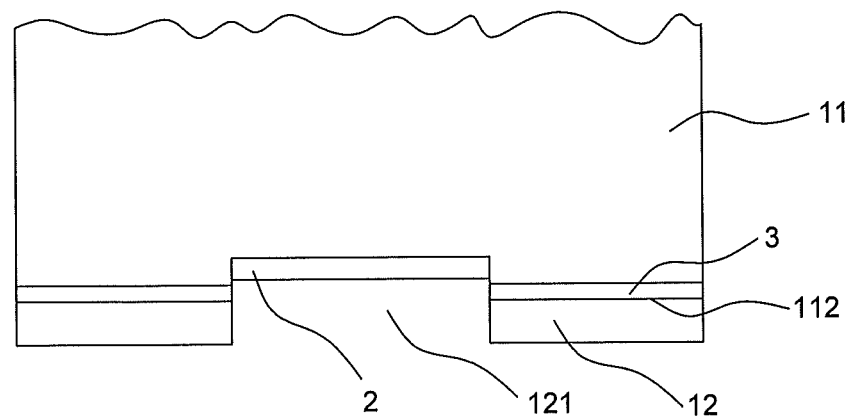
FIG. 12 shows a manufacturing step in an exemplary manufacturing method of an exemplary reverse-conducting IGBT according to the disclosure.

For the manufacturing of an exemplary reverse-conducting semiconductor device 10 on the collector side 112 the following are performed:

A p type first layer 32 can be created on the second side 112. This first layer 32 can be created by implantation of ions and afterwards performing an anneal step for the activation of the layer 32. The anneal step can be performed as a high temperature anneal with a temperature above 900° C. Afterwards, as shown in FIG. 10, a mask 12 with at least one opening 121 can be created on the first layer 32. Those parts of the first layer 32, on which an opening 121 of the mask 12 is arranged, can be removed (FIG. 11), the remaining parts of the first layer 32 thereby forming a third layer 3. This partial removing of the first layer 32 can be done by etching, for example, by dry or wet silicon etching. The mask 12 can be attached to the wafer as a resist mask. The mask 12 can be non-detachable, i.e., the mask 12 is destroyed if trying to separate the mask 12 from the wafer 11.

Figure 13:
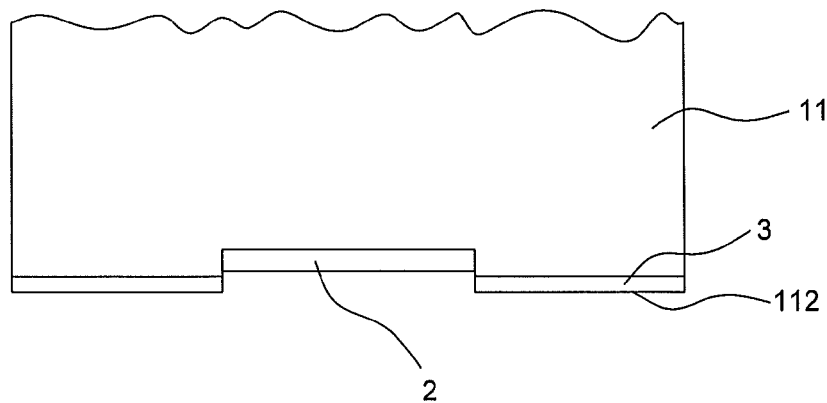
FIG. 13 shows a manufacturing step in an exemplary manufacturing method of an exemplary reverse-conducting IGBT according to the disclosure.
Figure 14:
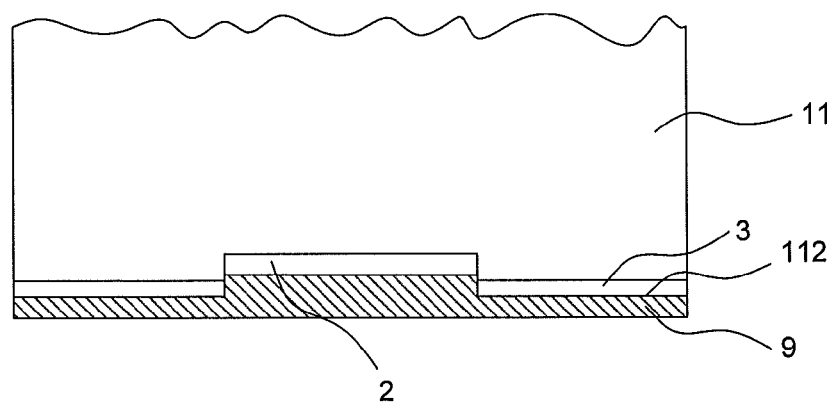
FIG. 14 shows a manufacturing step in an exemplary manufacturing method of an exemplary reverse-conducting IGBT according to the disclosure.

Afterwards, the second layer 2, which is an n type layer in this case, can be manufactured by implantation of ions into the wafer 11 on the second side 112 into those parts of the wafer 11, on which the at least one opening 121 is arranged, using the mask 12 as a barrier. The mask 12 can be used as a mask for this process, preventing ions from penetrating into the wafer 11 on those parts, on which the mask 12 is arranged. Then the mask 12 is removed (FIG. 13) and an anneal step for the activation of the second layer 2 is performed.

For finalizing the exemplary RC-IGBT 10, a second electrical contact 9 can be created on the second side 112 on the second and third layers 2, 3 so that the second electrical contact 9 is in direct electrical contact to the second and third layer 2, 3.

The third layer 3 can be created with a thickness in a range of 0.5 up to 2 μm so that the minimum distance 22 between the first and second plane, corresponding at least to the thickness of the third layer 3, needs also to be in a range 0.5 up to 2 μm.

The p type first layer 32 can be created in an exemplary embodiment by implantation of Boron ions. The ions are implanted at an energy between 20 keV up to 200 keV and/or with a dose of $1*10^{13}/cm^2$ up to $1*10^{16}/cm^2$. Afterwards the anneal step for the activation of the first layer 32 can be performed at a temperature of at least 900° C. The anneal step can be performed before the first electrical contact 8 is created. Laser anneal can also be done, which can be advantageous if an anneal on the second side is required, for example if the first electrical contact 8 has been created in advance and the first side shall not be extensively heated up.

The ions for the creation of the n type second layer 2 can be phosphorous. They are also implanted at an energy between 20 keV up to 200 keV and/or with a dose of $1*10^{13}/cm^2$ up to $1*10^{16}/cm^2$. The anneal step for the activation of the second layer 2 can be performed at a temperature of less than 900° C., in particular less than 750° C. In another exemplary embodiment, the anneal step can be performed at an even lower temperature of less than 600° C., in particular at 400 to 500° C. The anneal step for the activation of the second layer 2 can be performed simultaneously with the creation of the second electrical contact 9 or before the creation of the second electrical contact 9.

In another exemplary embodiment, the p type third layer 3 or first layer 32 can be made with a higher dose than the dose of the n type second layer 2, in particular the p type third layer 3 or first layer 32 can be made with a dose of more than $1*10^{14}/cm^2$ compared to the n type second layer 2, which is made with a dose, which is typically one magnitude lower than the dose of the p type third or first layer 3, 32. In general, that layer type of the at least one second or third layer 2, 3, which is of a different conductivity type than the base layer 1, can be created with a higher dose than that layer type of the at least one second and third layer 2, 3, which is of the same conductivity type as the base layer 1.

Alternatively to the third layer 3 or first layer 32 being of p type and the second layer being of n type, in another exemplary embodiment these conductivity types can be reversed so that the third layer 3 or first layer 32 are of n type and the second layer 2 is of p type. Also in this case, the method as described above can be done in the same way. For example, in this case the p type second layer 2 can be made with a high dose of more than $1*10^{14}/cm^2$ compared to the n type third layer 3, which is made with a dose, which is typically one magnitude lower than the dose of the p type second layer 2. Both layers then can be annealed together with a temperature of at least 900° C., in particular by a laser anneal.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST 1 base layer
2 second layer
21 first plane
22 distance
3 third layer
31 second plane
32 first layer
4 fourth layer
41 ninth layer
5 fifth layer
6 sixth layer
61 first electrically insulating layer
62 second electrically insulating layer
7 seventh layer
8 first electrical contact
9 second electrical contact
10 RC-IGBT
101 emitter side
102 collector side
11 wafer
111 first side
112 second side
12 mask
121 opening
13 buffer layer
14 no snap-back effect
15 weak snap-back effect
16 strong snap-back effect
17 prior art diode snap-off
18 inventive RC-IGBT diode with soft recovery

What is claimed is:

1. Method for manufacturing a reverse-conducting semiconductor device, which includes a freewheeling diode and an insulated gate bipolar transistor on a common wafer, the method comprising:

providing the wafer, part of which wafer having an unamended doping in a finalized device forms a base layer, wherein the insulated gate bipolar transistor includes an emitter side and a collector side, in which the wafer of a first conductivity type with a first side and a second side opposite the first side is provided, the first side forming the emitter side and the second side forming the collector side of the insulated gate bipolar transistor, creating a first layer of the first conductivity type or of a second conductivity type on the second side of the wafer by implantation, creating a mask with at least one opening on the first layer and removing those parts of the first layer, on which an opening of the mask is arranged, the remaining parts of the first layer forming a third layer, implanting ions into the wafer on the second side into those parts of the wafer, on which the at least one opening is arranged and using the mask as a barrier for the ions to form a second layer of a different conductivity type than the third layer, removing the mask and performing annealing for the activation of the second layer, and creating a second electrical contact, which is in direct electrical contact to the second and third layer, on the second side.

2. Method for manufacturing a reverse-conducting semiconductor device according to claim 1, wherein
the third layer is of the second conductivity type and the second layer is of the first conductivity type.

3. Method for manufacturing a reverse-conducting semiconductor device according to claim 1, wherein
the third layer is of the first conductivity type and the second layer is of the second conductivity type.

4. Method for manufacturing a reverse-conducting semiconductor device according to claim 2, wherein
that layer of the at least one second or third layer, which is of the second conductivity type, is created with a thickness in a range between 0.5 µm up to 2 µm.

5. Method for manufacturing a reverse-conducting semiconductor device according to claim 1, wherein
the at least one first layer is created by implantation of ions and afterwards annealing for the activation of the at least one first layer is performed.

6. Method for manufacturing a reverse-conducting semiconductor device according to claim 1, wherein
the removal of those parts of the first layer on which an opening of the mask is arranged, is performed by etching.

7. Method for manufacturing a reverse-conducting semiconductor device according to claim 2, wherein
creating the at least one second or the at least one first layer by implantation of Boron ions, wherein the ions are in particular implanted at energies of 20 keV up to 200 keV and/or with doses of $1*10^{13}/cm^2$ up to $1*10^{16}/cm^2$.

8. Method for manufacturing a reverse-conducting semiconductor device according to claim 2, wherein
creating the at least one first layer by implantation of ions and afterwards annealing for the activation of the at least one first layer is performed at a temperature of at least 900° C.

9. Method for manufacturing a reverse-conducting semiconductor device according to claim 2, wherein
the ions for the creation of the at least one second or at least one first layer, are Phosphorous and in that the ions are in particular implanted at energies of 20 keV up to 200 keV and/or with doses of $1*10^{13}/cm^2$ up to $1*10^{16}/cm^2$.

10. Method for manufacturing a reverse-conducting semiconductor device according to claim 2, wherein
the ions for the creation of the at least one second layer are Phosphorous and for the creation of the at least one first layer Boron.

11. Method for manufacturing a reverse-conducting semiconductor device according to claim 2, wherein
annealing for the activation of the at least one second layer is performed.

12. Method for manufacturing a reverse-conducting semiconductor device according to claim 1, wherein
annealing for the activation of the second layer is performed simultaneously with the creation of the second electrical contact.

13. Method for manufacturing a reverse-conducting semiconductor device according to claim 3, wherein
that layer of the at least one second or first layer, which is of the second conductivity type, is created with a thickness in a range between 0.5 µm up to 2 µm.

14. Method for manufacturing a reverse-conducting semiconductor device according to claim 2, wherein
the at least one first layer is created by implantation of ions and afterwards annealing for the activation of the at least one first layer is performed.

15. Method for manufacturing a reverse-conducting semiconductor device according to claim 3, wherein
the at least one first layer is created by implantation of ions and afterwards annealing for the activation of the at least one first layer is performed.

16. Method for manufacturing a reverse-conducting semiconductor device according to claim 2, wherein
the removal of those parts of the first layer on which an opening of the mask is arranged, is performed by etching.

17. Method for manufacturing a reverse-conducting semiconductor device according to claim 3, wherein
creating the at least one second or the at least one first layer by implantation of Boron ions, wherein the ions are in particular implanted at energies of 20 keV up to 200 keV and/or with doses of $1*10^{13}/cm^2$ up to $1*10^{16}/cm^2$.

18. Method for manufacturing a reverse-conducting semiconductor device according to claim 3, wherein
the ions for the creation of the at least one second or at least one first layer, are Phosphorous and in that the ions are in particular implanted at energies of 20 keV up to 200 keV and/or with doses of $1*10^{13}/cm^2$ up to $1*10^{16}/cm^2$.

19. Method for manufacturing a reverse-conducting semiconductor device according to claim 3, wherein
the ions for the creation of the at least one second layer are Boron and in that the ions for the creation of the at least one first layer are Phosphorous.

20. Method for manufacturing a reverse-conducting semiconductor device according to claim 11, wherein
annealing for the activation of the at least one second layer is performed at a temperature of less than 900° C.

21. Method for manufacturing a reverse-conducting semiconductor device according to claim 11, wherein
annealing for the activation of the at least one second layer is performed at a temperature of less than 750° C.

* * * * *